US010381279B2

(12) United States Patent
Yajima

(10) Patent No.: US 10,381,279 B2
(45) Date of Patent: *Aug. 13, 2019

(54) METHOD OF MANUFACTURING SEMICONDUCTOR DEVICE AND SEMICONDUCTOR DEVICE

(71) Applicant: RENESAS ELECTRONICS CORPORATION, Tokyo (JP)

(72) Inventor: Akira Yajima, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/798,369

(22) Filed: Oct. 30, 2017

(65) Prior Publication Data

US 2018/0068910 A1    Mar. 8, 2018

Related U.S. Application Data

(63) Continuation of application No. 15/245,700, filed on Aug. 24, 2016, now Pat. No. 9,837,326.

(30) Foreign Application Priority Data

Aug. 27, 2015   (JP) ................. 2015-168248

(51) Int. Cl.
   *H01L 21/66*   (2006.01)
   *G11C 29/48*   (2006.01)
   (Continued)

(52) U.S. Cl.
   CPC .............. *H01L 22/32* (2013.01); *G11C 29/06* (2013.01); *G11C 29/48* (2013.01); *H01L 21/324* (2013.01);
   (Continued)

(58) Field of Classification Search
   CPC .................. H01L 22/32; H01L 22/14; H01L 2224/48091; H01L 21/324;
   (Continued)

(56) References Cited

U.S. PATENT DOCUMENTS

2003/0153172 A1 * 8/2003 Yajima .................... H01L 22/34
                                                              438/612
2006/0164110 A1   7/2006 Miyazaki et al.
   (Continued)

FOREIGN PATENT DOCUMENTS

| JP | 2003-234348 A | 8/2003 |
|----|---------------|--------|
| JP | 2009-246218 A | 10/2009 |
| JP | 2011-049530 A | 3/2011 |

OTHER PUBLICATIONS

Extended European Search Report issued in corresponding EP Application No. 16183620.0, dated Feb. 2, 2017.
(Continued)

*Primary Examiner* — Tong-Ho Kim
(74) *Attorney, Agent, or Firm* — McDermott Will & Emery LLP

(57) ABSTRACT

To enhance reliability of a test by suppressing defective bonding of a solder in the test of a semiconductor device, a method of manufacturing the semiconductor device includes: preparing a semiconductor wafer that includes a first pad electrode provided with a first cap film and a second pad electrode provided with a second cap film. Further, a polyimide layer that includes a first opening on the first pad electrode and a second opening on the second pad electrode is formed, and then, a rearrangement wiring that is connected to the second pad electrode via the second opening is formed. Next, an opening is formed in the polyimide layer such that an organic reaction layer remains on each of the first pad electrode and a bump land of the rearrangement
(Continued)

wiring, then heat processing is performed on the semiconductor wafer, and then, a bump is formed on the rearrangement wiring.

12 Claims, 15 Drawing Sheets

(51) Int. Cl.
    *H01L 25/065*     (2006.01)
    *H01L 21/324*     (2006.01)
    *H01L 21/4763*     (2006.01)
    *G11C 29/06*     (2006.01)
    *H01L 23/00*     (2006.01)
    *H01L 23/31*     (2006.01)
    *G11C 29/56*     (2006.01)

(52) U.S. Cl.
    CPC ........ *H01L 21/47635* (2013.01); *H01L 22/14* (2013.01); *H01L 24/03* (2013.01); *H01L 24/05* (2013.01); *H01L 24/06* (2013.01); *H01L 24/11* (2013.01); *H01L 24/14* (2013.01); *H01L 24/43* (2013.01); *H01L 24/49* (2013.01); *H01L 24/85* (2013.01); *H01L 25/0655* (2013.01); *H01L 25/0657* (2013.01); *G11C 2029/5602* (2013.01); *H01L 23/3192* (2013.01); *H01L 24/13* (2013.01); *H01L 24/16* (2013.01); *H01L 24/48* (2013.01); *H01L 24/73* (2013.01); *H01L 2224/02311* (2013.01); *H01L 2224/02331* (2013.01); *H01L 2224/02377* (2013.01); *H01L 2224/03009* (2013.01); *H01L 2224/0392* (2013.01); *H01L 2224/0401* (2013.01); *H01L 2224/04042* (2013.01); *H01L 2224/05022* (2013.01); *H01L 2224/05124* (2013.01); *H01L 2224/05147* (2013.01); *H01L 2224/05186* (2013.01); *H01L 2224/05548* (2013.01); *H01L 2224/05554* (2013.01); *H01L 2224/05567* (2013.01); *H01L 2224/05583* (2013.01); *H01L 2224/05655* (2013.01); *H01L 2224/05686* (2013.01); *H01L 2224/06102* (2013.01); *H01L 2224/131* (2013.01); *H01L 2224/13021* (2013.01); *H01L 2224/13022* (2013.01); *H01L 2224/13024* (2013.01); *H01L 2224/16145* (2013.01); *H01L 2224/451* (2013.01); *H01L 2224/48091* (2013.01); *H01L 2224/48138* (2013.01); *H01L 2224/48227* (2013.01); *H01L 2224/73207* (2013.01); *H01L 2224/73253* (2013.01); *H01L 2224/73265* (2013.01); *H01L 2924/04941* (2013.01)

(58) Field of Classification Search
    CPC ... H01L 21/47635; H01L 24/03; H01L 24/06; H01L 24/11; H01L 24/43; H01L 24/49; H01L 24/85; H01L 25/0655; H01L 24/05; H01L 24/13; H01L 24/16; H01L 24/48; H01L 24/73; H01L 23/3192; H01L 25/0657; H01L 2224/02311; H01L 2224/02331; H01L 2224/02377; H01L 2224/03009; H01L 2224/0392; H01L 2224/0401; H01L 2224/04042; H01L 2224/05022; H01L 2224/02124; H01L 2224/05147; H01L 2224/05186; H01L 2224/05548; H01L 2224/05554; H01L 2224/05567; H01L 2224/05583; H01L 2224/05655; H01L 2224/05686; H01L 2224/06102; H01L 2224/13021; H01L 2224/10322; H01L 2224/13024; H01L 2224/131; H01L 2224/16145; H01L 2224/451; H01L 2224/48138; H01L 2224/48227; H01L 2224/73207; H01L 2224/73253; H01L 2224/73265; H01L 2924/04941; H01L 24/14; G11C 29/06; G11C 29/48; G11C 2029/5602
    USPC ............................................ 257/48; 438/612
    See application file for complete search history.

(56) References Cited

U.S. PATENT DOCUMENTS

| | | |
|---|---|---|
| 2009/0200664 A1 | 8/2009 | Migita et al. |
| 2009/0243118 A1 | 10/2009 | Akiba et al. |
| 2010/0181650 A1 | 7/2010 | Shigihara et al. |
| 2011/0024901 A1* | 2/2011 | Yamashita ............. H01L 24/11 257/737 |
| 2011/0140185 A1 | 6/2011 | Nishimura et al. |
| 2011/0294238 A1* | 12/2011 | Ertle ...................... H01L 22/32 438/15 |
| 2012/0074541 A1 | 3/2012 | Ito et al. |

OTHER PUBLICATIONS

Notice of Allowance issued in related U.S. Appl. No. 15/245,700, dated Aug. 22, 2017.

Office Action issued in related U.S. Appl. No. 15/245,700, dated Feb. 27, 2017.

Japanese Office Action issued in corresponding Japanese Patent Application No. 2015-168248, dated Feb. 26, 2019, with English Translation.

\* cited by examiner

FIG. 9
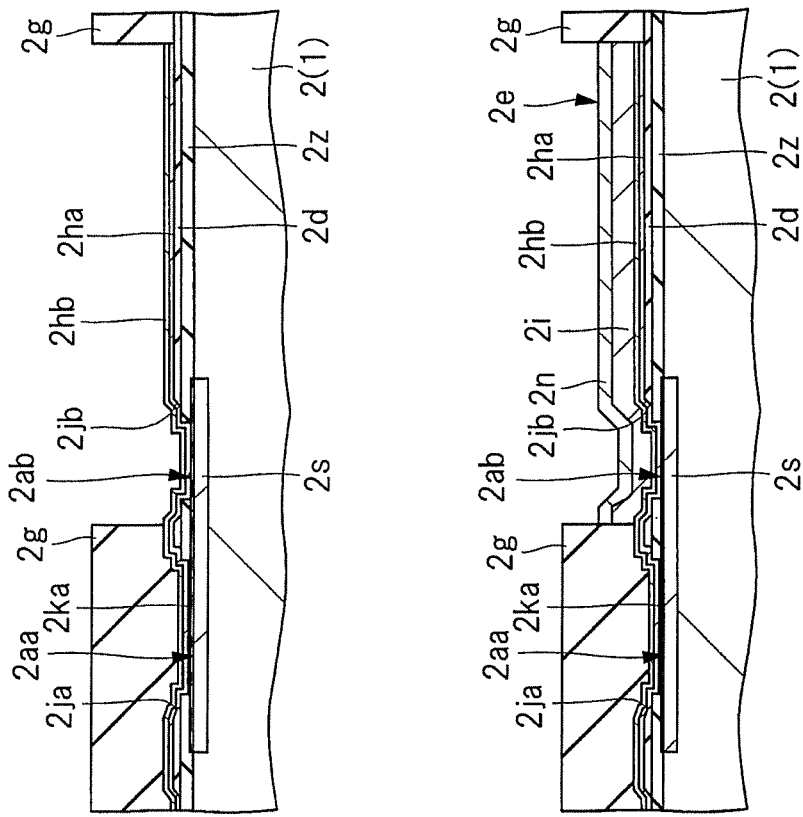
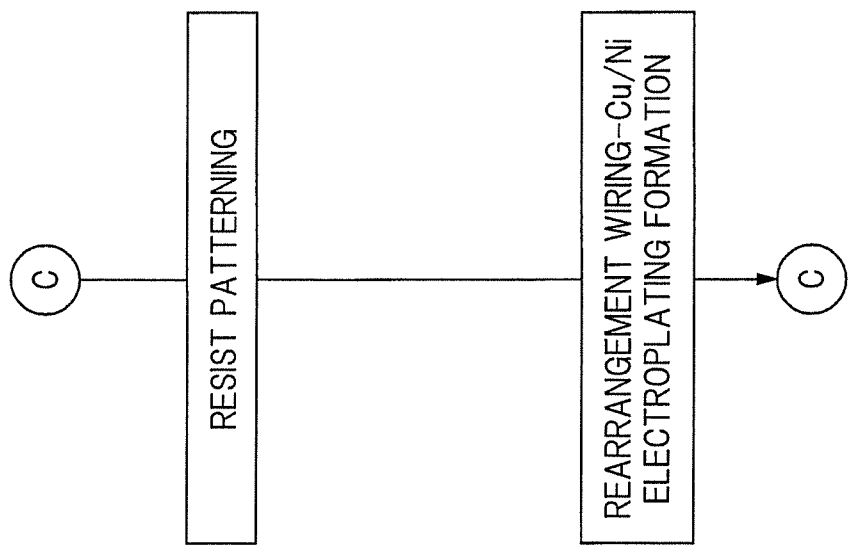

FIG. 12
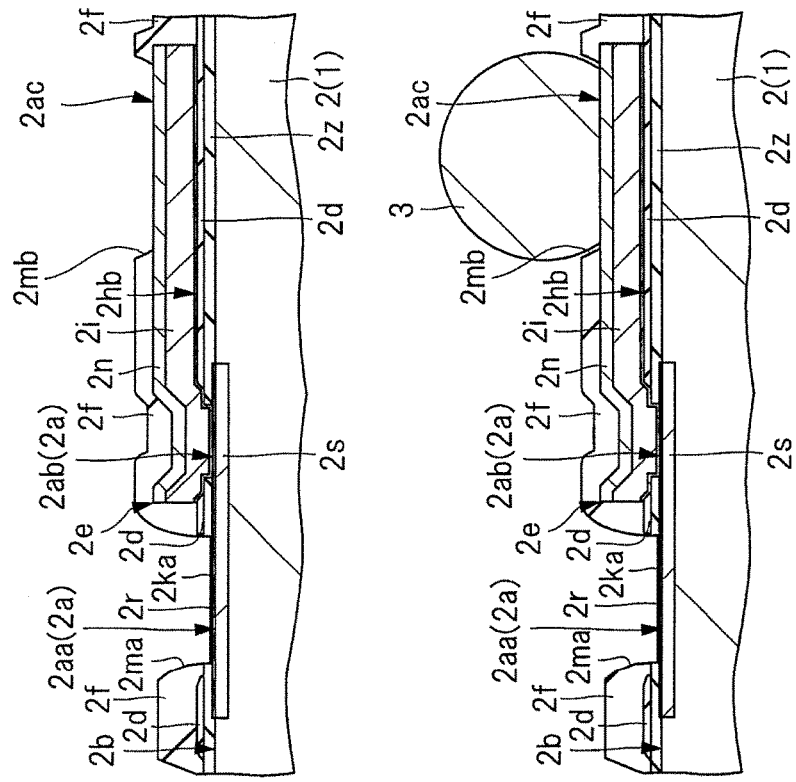
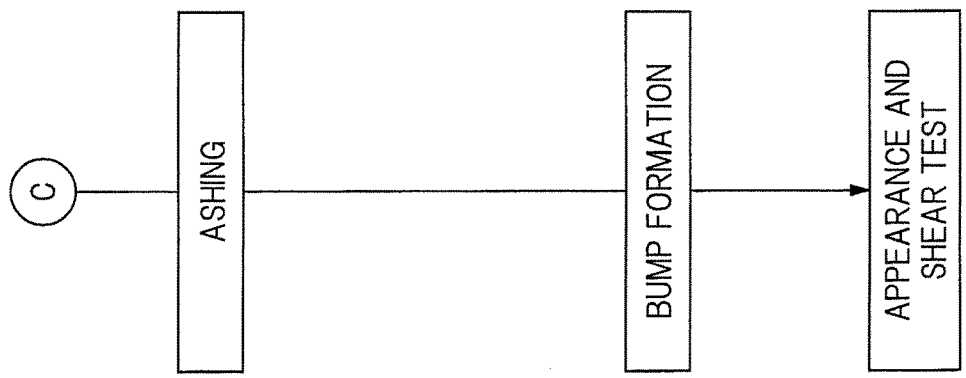

METHOD OF MANUFACTURING SEMICONDUCTOR DEVICE AND SEMICONDUCTOR DEVICE

CROSS-REFERENCE TO RELATED APPLICATION

The present application is a continuation of U.S. patent application Ser. No. 15/245,700 filed Aug. 24, 2016, which claims priority from Japanese Patent Application No. 2015-168248 filed on Aug. 27, 2015, the contents of which are hereby incorporated by reference into this application.

TECHNICAL FIELD OF THE INVENTION

The present invention relates to technique of manufacturing a semiconductor device, for example, technique for a wafer process package and so forth, and to a semiconductor device.

BACKGROUND OF THE INVENTION

In a wafer process package (WPP, or referred to also as a wafer level package (WLP)), a solder bump is bonded to each terminating end of a plurality of rearrangement wirings (rewirings).

There is a description in, for example, Japanese Patent Application Laid-Open No. 2009-246218 (Patent Document 1) regarding a structure and assembly of the wafer process package. Patent Document 1 discloses technique in which a probe needle is brought into contact with an electrode of a wafer process package.

SUMMARY OF THE INVENTION

In the above-described wafer process package, there is a step of testing a non-volatile memory during an assembly process when the non-volatile memory is incorporated in a semiconductor chip. This testing step includes a heat processing step, which is called a retention baking step, in which data is programmed in the non-volatile memory, and then, a thermal load is applied at 250° C. for about 72 hours, for example. Further, it is checked whether there is a loss in the data programmed in the memory after the retention baking step.

Here, when the rearrangement wiring is formed after the step of testing the memory, for example, there is a possibility that the data programmed in the memory is lost in the heat processing at high temperature which is implemented at the time of forming the rearrangement wiring. Accordingly, it is preferable to perform the step of testing the non-volatile memory after forming the rearrangement wiring in order to prevent the loss in the data programmed in the memory.

In this case, the memory test is performed by bringing the probe into contact with a pad of the rearrangement wiring in the above-described step of testing the non-volatile memory, but accuracy of the test decreases since a Ni (nickel) layer formed on a surface of a Cu (copper) layer of the rearrangement wiring is hard and a contact resistance with the probe is large. At this time, it is considered to perform Au plating on the pad of the rearrangement wiring in order to achieve a countermeasure against the contact resistance of the probe and to secure the wettability of the solder bump, which causes Ni to spring up and be oxidized on an Au (gold)-plated film due to the retention baking, and as a result, leads to an increase of the contact resistance of the probe and defective wettability and defective bonding of the solder.

Other problems and novel features will become apparent from the description of the specification and the attached drawings.

In a method of manufacturing a semiconductor device of an embodiment of the present invention, a semiconductor substrate is prepared, the semiconductor substrate including a first pad electrode and a second pad electrode, the first pad electrode being formed at an uppermost layer of a plurality of wiring layers and having a first metal film formed on a surface of the first pad electrode, and the second pad electrode being electrically connected to the first pad electrode, being formed at the uppermost layer of the plurality of wiring layers and having a second metal film formed on a surface of the second pad electrode. Further, a first insulating film is formed having a first opening for exposing the first metal film of the first pad electrode, and a second opening for exposing the second metal film in the second pad electrode. A wiring which is electrically connected to the second pad electrode via the second opening is formed. Further, a third opening is formed in a second insulating film above the first pad electrode and a fourth opening of the second insulating film above the wiring is formed while leaving an organic reaction layer on each surface of the first pad electrode and the wiring. Still further, after forming the fourth opening, heat processing is performed on the semiconductor substrate, and then a bump is formed in the fourth opening on the wiring.

A semiconductor device of an embodiment includes: a semiconductor chip having a main surface in which a semiconductor circuit is formed; a plurality of first pad electrodes electrically connected to the semiconductor circuit and are exposed at the main surface; a plurality of second pad electrodes electrically connected to the plurality of first pad electrodes, respectively, and formed on the same layer with each of the plurality of first pad electrodes; and a plurality of wirings covering each of the plurality of second pad electrodes and are electrically connected to the plurality of second pad electrodes, respectively. Further, the semiconductor device includes an insulating film formed on the plurality of wirings; and a plurality of bumps provided in opening port ions of the insulating films of the plurality of wirings. Each surface of the plurality of first pad electrodes is exposed.

According to the embodiment described above, in a test of a semiconductor device, reliability of the test can be improved with suppressing a defective solder joint.

BRIEF DESCRIPTIONS OF THE DRAWINGS

FIG. 9 is a flow chart with a cross-sectional view illustrating a part of the manufacturing method of the semiconductor device of FIG. 1;

FIG. 12 is a flow chart with a cross-sectional view illustrating a part of the manufacturing method of the semiconductor device of FIG. 1;

DESCRIPTIONS OF THE PREFERRED EMBODIMENTS

Figure 1:
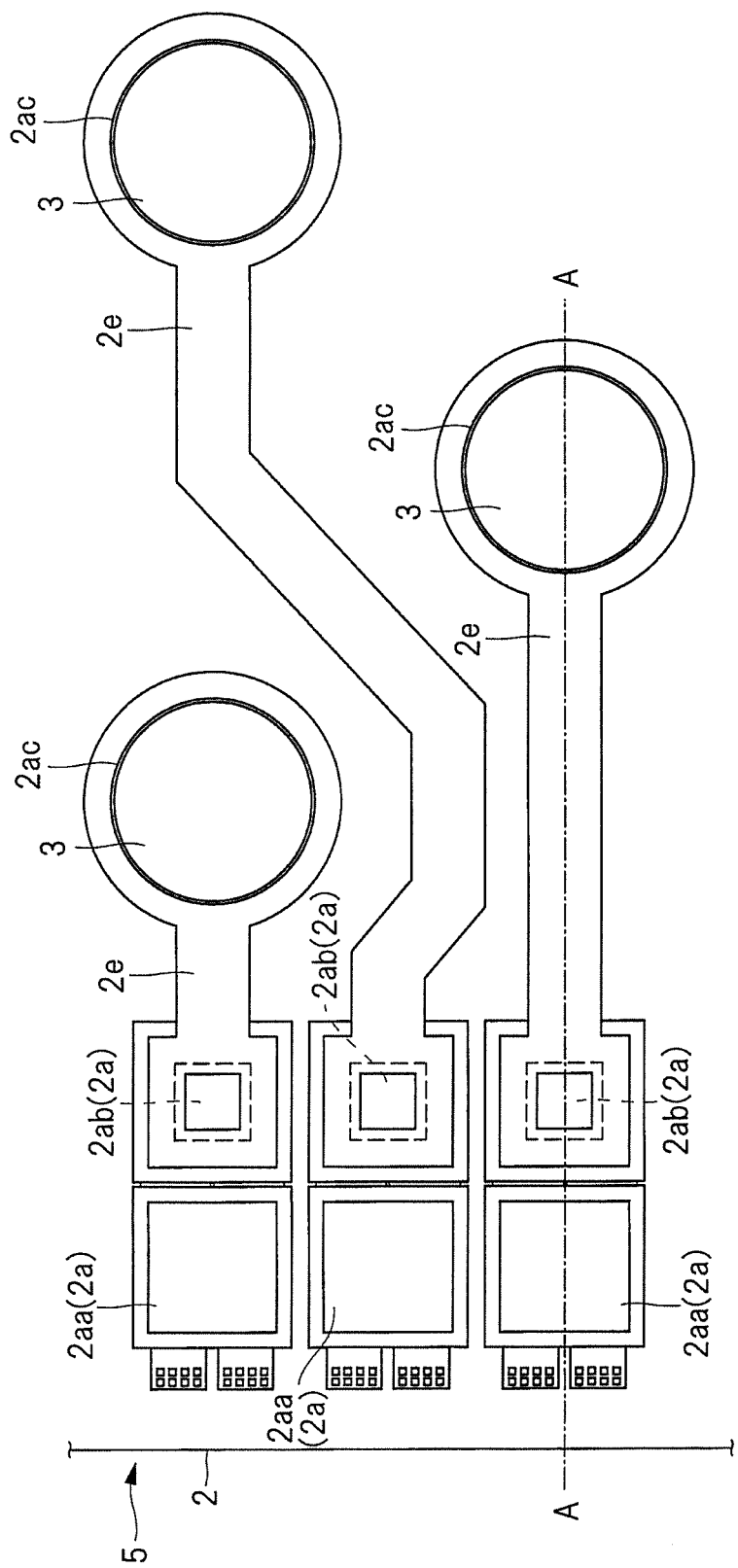
FIG. 1 is a partial plan view transparently illustrating an example of an internal structure of the main part of the semiconductor device according to an embodiment.

In an embodiment described hereinafter, repetitive descriptions of the same or similar components will be omitted.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Further, it is needless to say that such phrases as "formed of A", "made of A", "comprising A", "including A", "having A" do not eliminate other elements than A unless otherwise stated that the element is limited to that. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, the embodiment of the present invention will be described in detail based on the accompanying drawings.

Note that, in all of the drawings for describing the embodiments, identical members are provided with the same reference character in principle, and are not repetitively described. Note that even a plan view may be hatched in order to make the drawing easily understood.

<Structure of Semiconductor Device>

Figure 2:
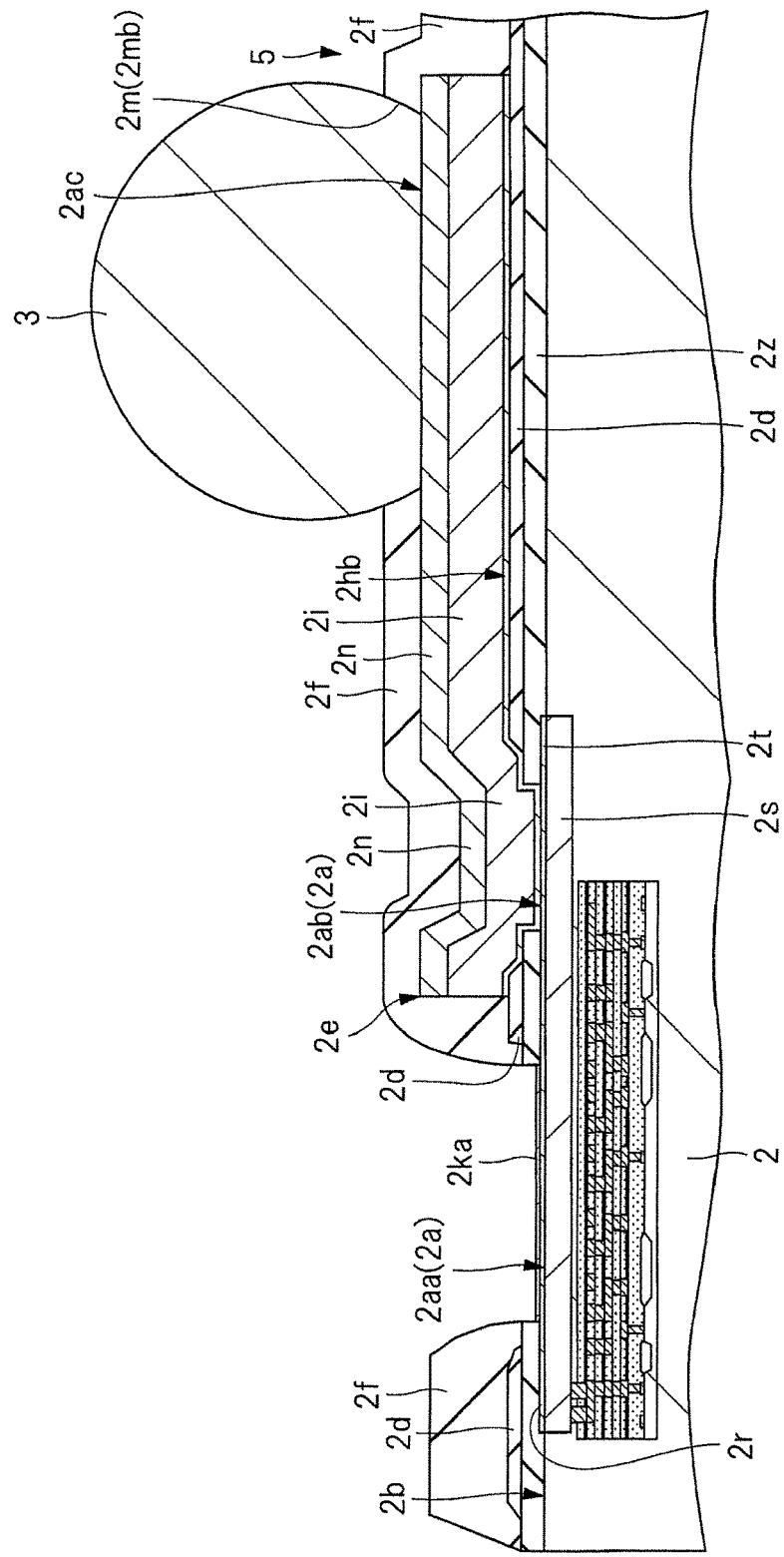
FIG. 2 is a cross-sectional view illustrating a structure taken along a line A-A illustrated in FIG. 1.
Figure 3:
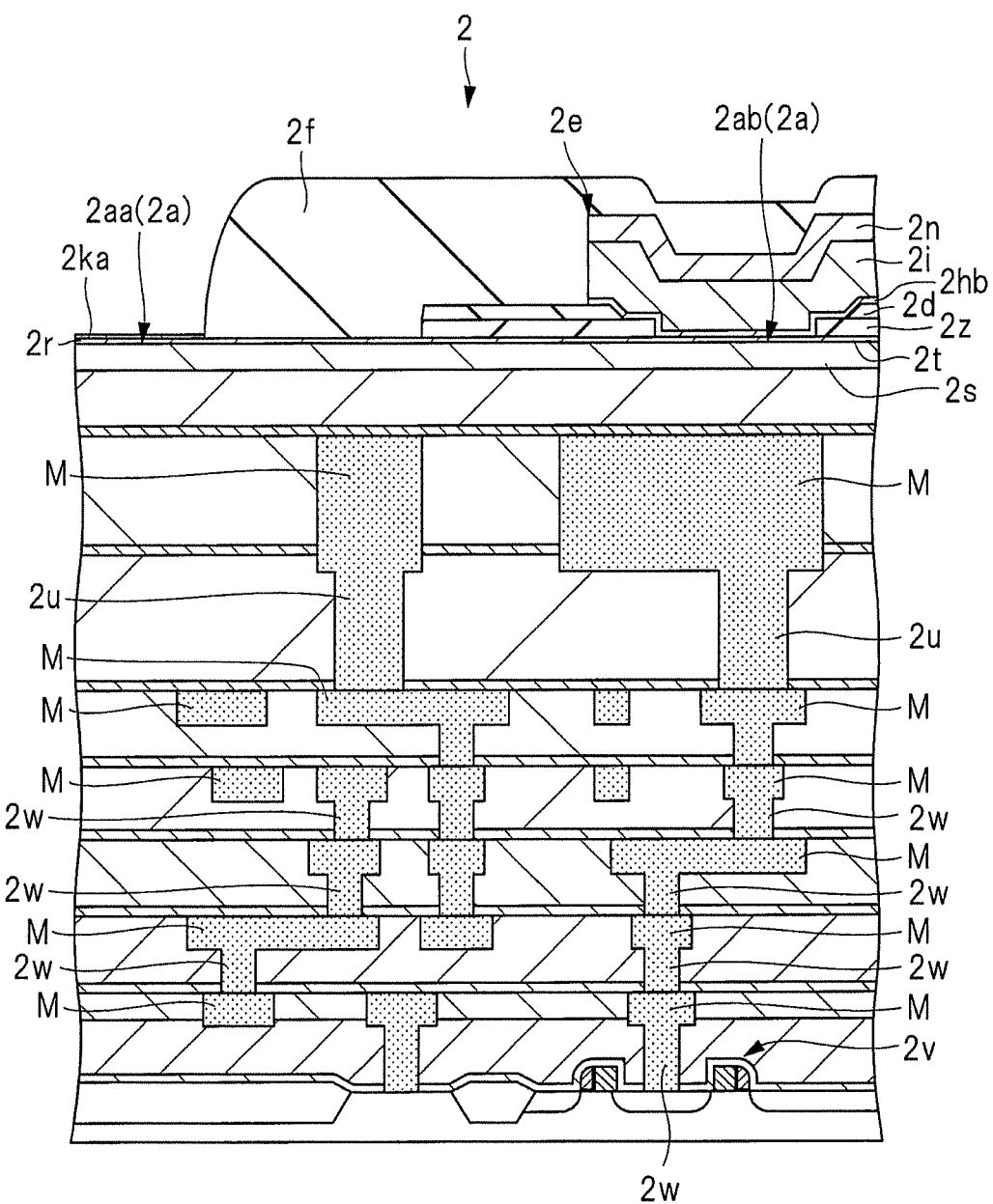
FIG. 3 is an enlarged partial cross-sectional view illustrating an example of the internal structure of the main part of the semiconductor device illustrated in FIG. 1.
Figure 4:
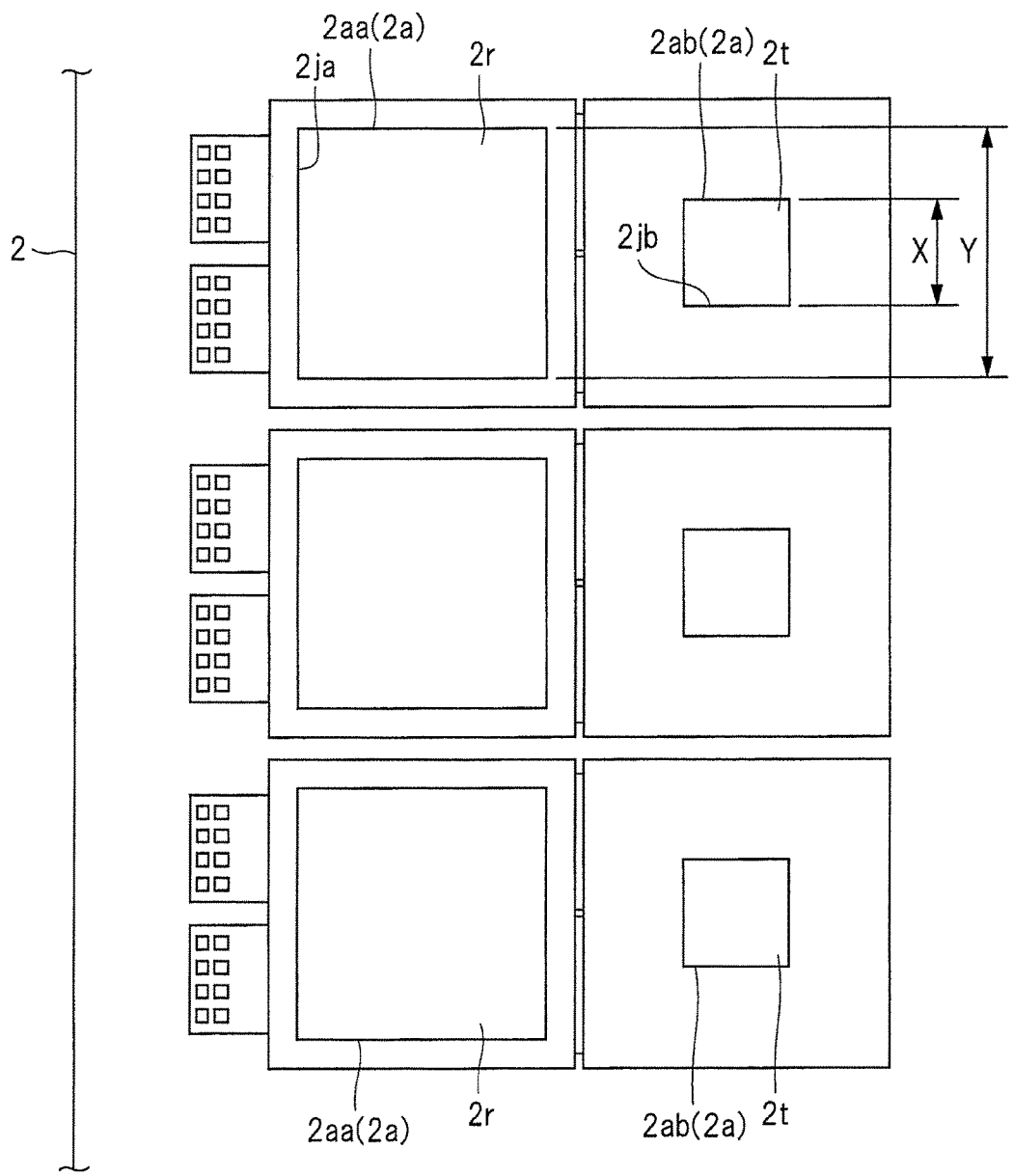
FIG. 4 is an enlarged partial plan view illustrating an example of a structure of a pad of the main part illustrating the semiconductor device illustrated in FIG. 1.
Figure 5:
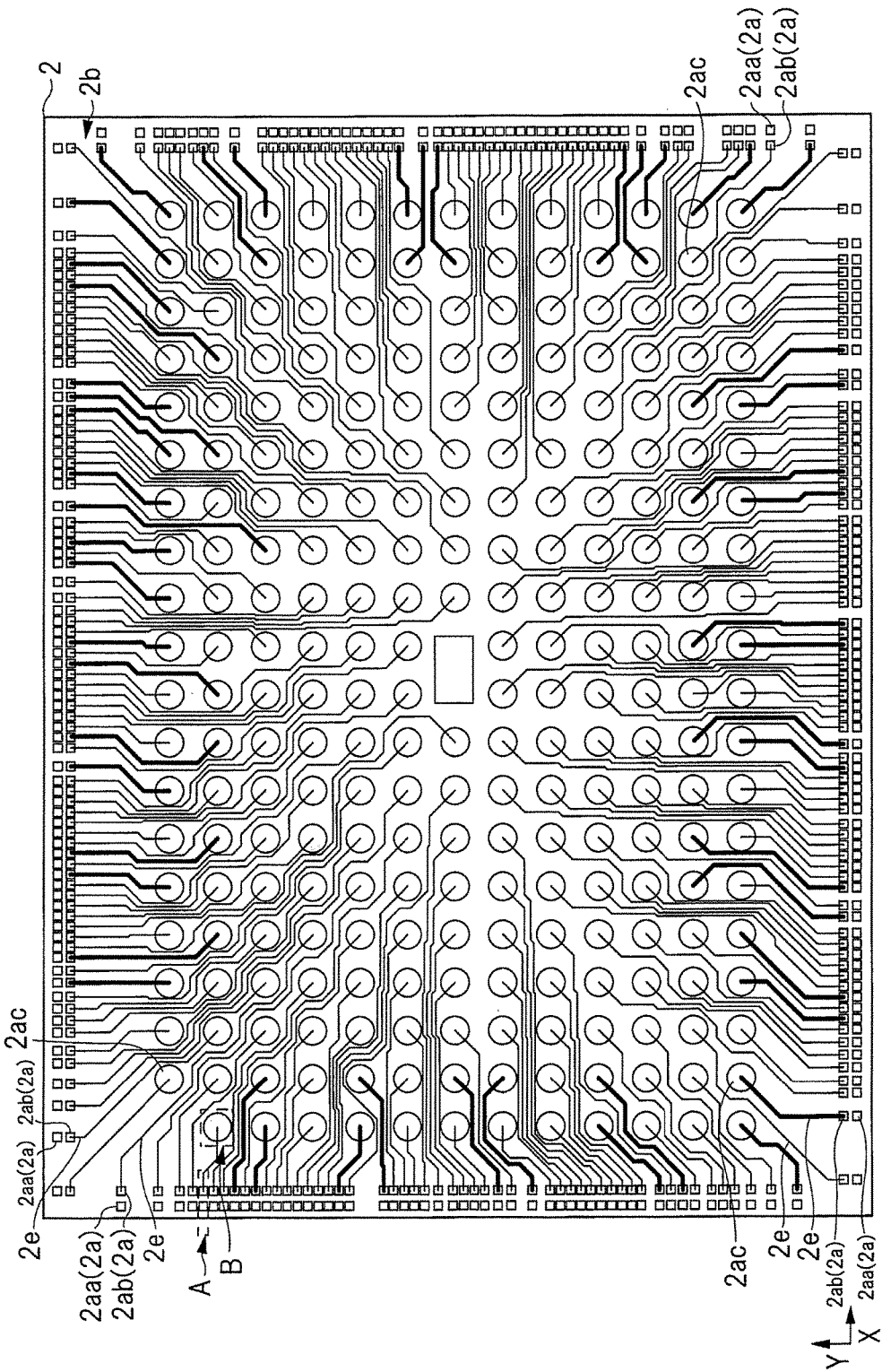
FIG. 5 is a plan view illustrating each example of a pad array and a rewiring of the main part of the semiconductor device illustrated in FIG. 1.
Figure 6:
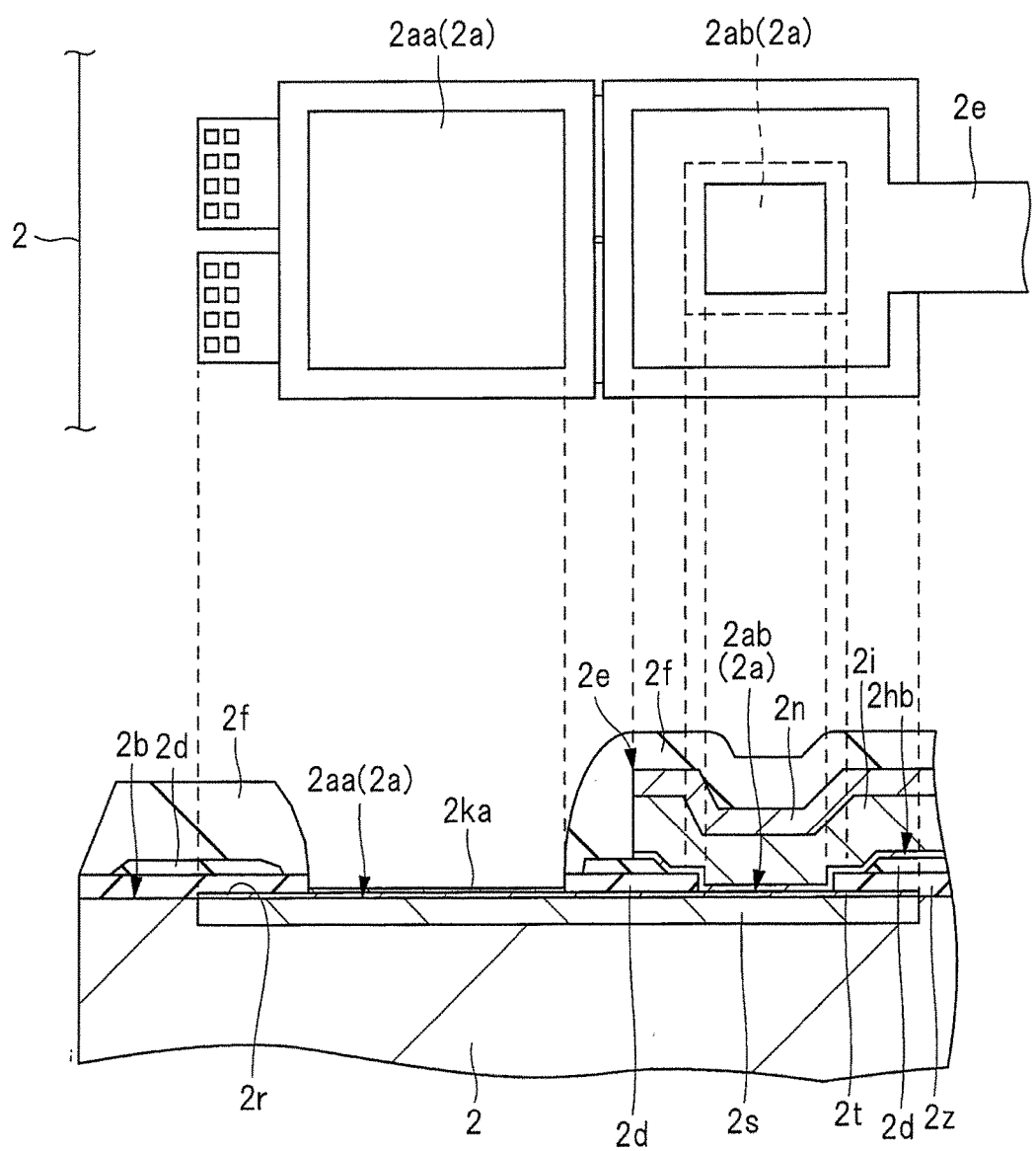
FIG. 6 is an enlarged partial plan view and an enlarged partial cross-sectional view illustrating an example of a structure of a part A of FIG. 5.
Figure 7:
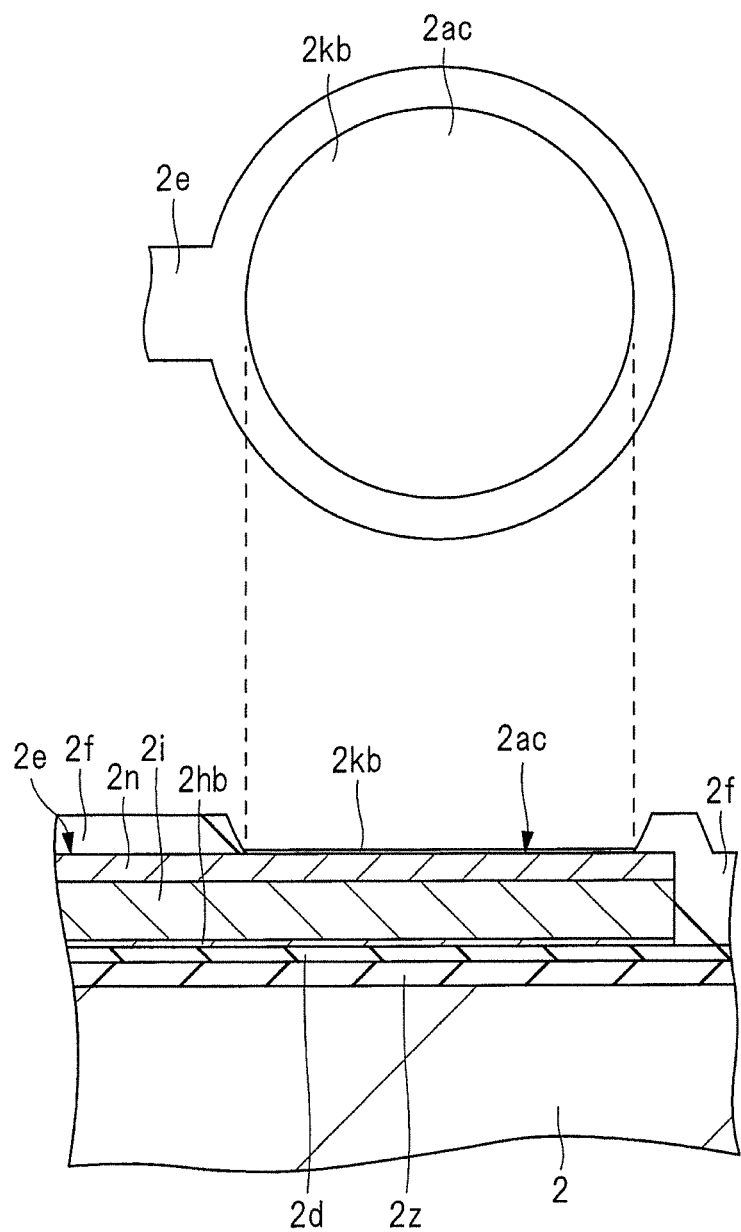
FIG. 7 is an enlarged partial plan view and an enlarged partial cross-sectional view illustrating an example of a structure of a part B of FIG. 5.

FIG. 1 is a partial plan view transparently illustrating an example of an internal structure of the main part of the semiconductor device according to an embodiment; FIG. 2 is a cross-sectional view illustrating a structure taken along a line A-A illustrated in FIG. 1; FIG. 3 is an enlarged partial cross-sectional view illustrating an example of the internal structure of the main part of the semiconductor device illustrated in FIG. 1; and FIG. 4 is an enlarged partial plan view illustrating an example of a structure of a pad of the main part illustrating the semiconductor device illustrated in FIG. 1. In addition, FIG. 5 is a plan view illustrating each example of a pad array and a rewiring of the main part of the semiconductor device illustrated in FIG. 1; FIG. 6 is an enlarged partial plan view and an enlarged partial cross-sectional view illustrating an example of a structure of a part A of FIG. 5; and FIG. 7 is an enlarged partial plan view and an enlarged partial cross-sectional view illustrating an example of a structure of a part B of FIG. 5.

A semiconductor device according to the present embodiment illustrated in FIG. 1 is a wafer process package 5, and a small semiconductor package which is substantially equal to a size of a chip.

A description will be given regarding a configuration of the wafer process package 5 according to the present embodiment with reference to FIGS. 1 and 2. The wafer process package 5 includes a semiconductor chip 2 having a main surface 2b, in which a semiconductor circuit is formed on the main surface 2b, a plurality of first pad electrodes 2aa which are electrically connected to the semiconductor circuit and exposed at the main surface 2b, and a plurality of second pad electrodes 2ab which are electrically connected to each of the plurality of first pad electrodes 2aa, and formed on the same layer with each of the plurality of first pad electrodes 2aa.

That is, a plurality of pad electrodes 2a are provided side by side in two columns, and there are those which are arranged side by side at the outer side are the plurality of first pad electrodes 2aa while there are those which are arranged side by side at the inner side are the plurality of second pad electrodes 2ab as illustrated in FIG. 1.

Further, rearrangement wirings (wirings) 2e are connected to each of the plurality of second pad electrodes 2ab. The rearrangement wiring 2e is provided for rearranging each position of the plurality of second pad electrodes 2ab to a different position, and is also called the rewiring.

In other words, each of the plurality of first pad electrodes 2aa is arranged side by side on an end portion side (peripheral edge portion side) of the main surface 2b of the semiconductor chip 2, and each of the plurality of second pad electrodes 2ab is arranged at the inner side than each of the plurality of first pad electrodes 2aa. Further, the rearrangement wiring 2e is led out from each of the plurality of second pad electrodes 2ab arranged at the inner side.

Specifically, the rearrangement wiring 2e covers each of the plurality of second pad electrodes 2ab, and further, is electrically connected to each of the plurality of second pad electrodes 2ab as illustrated in FIG. 2. Further, bump lands 2ac are formed at end portions on the opposite side of the second pad electrodes 2ab of the rearrangement wirings 2e, and each of a solder bump (bump) 3 is mounted to each of the bump lands 2ac as an external terminal of the wafer process package 5.

Specifically, a polyimide layer 2f serving as an insulating film is formed on each of the plurality of rearrangement wirings 2e, further, the bump land 2ac is formed in an opening portion 2m of the polyimide layer 2f on each of the plurality of rearrangement wirings 2e, and the solder bump 3 is provided on each of the bump lands 2ac.

Incidentally, each surface of the plurality of first pad electrodes 2aa arranged at the outer side is exposed. Specifically, a first cap film (first metal film) 2r is formed on each surface of the first pad electrodes 2aa, and further, an organic reaction layer 2ka is foisted on the first cap film 2r as illustrated in FIG. 2. In addition, the first cap film 2r extends on each of the plurality of second pad electrodes 2ab.

Specifically, the first cap film 2r is formed on a surface of an Al (aluminum) pad 2s in the first pad electrode 2aa, and further, the organic reaction layer 2ka, which is an organic thin film, is formed on the surface of the first cap film 2r as illustrated in FIG. 2. Further, the Al pad 2s of the first pad electrode 2aa is linked with the Al pad 2s of the second pad electrode 2ab. That is, the Al pad 2s of the first pad electrode 2aa and the Al pad 2s of the second pad electrode 2ab are integrally formed. In other words, the Al pad 2s according to the present embodiment is considered also as the Al pad 2s equipped with a cap film.

Further, a second cap film (second metal film) 2t is also formed on a surface of the Al pad 2s in a region of the second pad electrode 2ab. That is, the first cap film 2r and the second cap film 2t are also integrally formed on the Al pad 2s.

Further, the rearrangement wiring 2e is connected to the second pad electrode 2ab.

Incidentally, the first cap film 2r and the second cap film 2t are made of, for example, TiN (titanium nitride). Accordingly, the first cap film 2r made of TiN is exposed to the first pad electrode 2aa.

In addition, the rearrangement wiring 2e has, for example, a three-layer structure, and includes, for example, a seed layer 2hb made of a Cu (copper) film, a Cu layer 2i, and a Ni (nickel) layer 2n from a lower layer side toward an upper layer side.

In addition, a plurality of wiring layers 2u are formed below the first pad electrodes 2aa, a wiring M of each layer is electrically connected via a plug 2w as illustrated in FIG. 3. Further, memory cells 2v are formed on both sides of the plug 2w serving as a drain at the lowermost layer of the wiring layer 2u. The memory cell 2v is, for example, a non-volatile memory (flash memory), and the semiconductor circuit including the non-volatile memory circuit is formed in the semiconductor chip 2 according to the present embodiment.

In addition, FIG. 4 is the plan view of each of the first pad electrode 2aa and the second pad electrode 2ab, and a first opening 2ja, which is an opening portion of the first pad electrode 2aa, has a size far larger than that of a second opening 2jb which is an opening portion of the second pad electrode 2ab (Y>X). This is because the first pad electrode 2aa is a pad for a probe test or wire bonding while the second pad electrode 2ab is a pad for rearrangement wiring connection, which will be described later.

It is possible to easily change each size of these pads by adjusting a size of an opening portion of an insulating film formed in the pad.

Next, a description will be given regarding a structure of the pad of the semiconductor chip to be mounted to the wafer process package 5 according to the present embodiment.

The semiconductor chip 2 illustrated in FIG. 5 has a structure before attaching the solder bump 3 that is illustrated in FIG. 2 thereto.

The pad electrodes 2a are provided in two columns on the main surface 2b of the semiconductor chip 2 along the peripheral edge portion thereof. Further, the rearrangement wirings 2e are provided on each of the second pad electrodes 2ab in the column at the inner side among the pad electrodes 2a arranged in two columns, and each of the plurality of rearrangement wirings 2e is led out toward the inside of the main surface 2b. Further, the bump lands 2ac are formed at the respective end portions of the rearrangement wirings 2e.

Incidentally, the respective bump lands 2ac are provided side by side at an equal pitch both in the X direction and in the Y direction on the main surface 2b. That is, the plurality of bump lands 2ac are provided side by side in a lattice style on the main surface 2b.

Accordingly, the plurality of solder bumps 3 are also arranged in a lattice style when the solder bumps 3 are mounted to each of the plurality of bump lands 2ac.

FIG. 6 illustrates the plan view and the cross-sectional view of the first pad electrode 2aa and the second pad electrode 2ab. The first pad electrode 2aa and the second pad electrode 2ab according to the present embodiment are configured such that the insulating film is interposed in the Al pad 2s having an elongated rectangular planar shape, and two openings are formed in the insulating film. Accordingly, the integrally formed Al pad 2s is divided into two electrode regions and used with the first pad electrode 2aa and the second pad electrode 2ab.

Accordingly, the Al pad 2s is formed to be integrally linked from the first pad electrode 2aa over the second pad electrode 2ab, and further, the first cap film 2r and the second cap film 2t, which are integrally formed, are arranged on the Al pad 2s. That is, the Al pad 2s is the Al pad 2s equipped with the cap film. Incidentally, the first cap film 2r and the second cap film 2t are made of, for example, TiN (titanium nitride).

Further, the organic reaction layer 2ka, which is extremely thin having a thickness of, for example, about several hundred nm (nano meters), is formed on the surface of the first cap film 2r of the first pad electrode 2aa.

In addition, the plurality of wiring layers 2u are formed below the first pad electrode 2aa, and further, the memory cells 2v are formed at the lowermost layer thereof as illustrated in FIG. 3, and the memory cell 2v is, for example, the non-volatile memory (flash memory) as described above.

In addition, the bump land 2ac is formed at the end portion of the rearrangement wiring 2e led out from the second pad electrode 2ab as illustrated in FIG. 7. An organic reaction layer 2kb, which is an organic thin film, is formed on a surface of the Ni layer 2n at the uppermost layer of the bump land 2ac illustrated in FIG. 2 before mounting the solder bump 3d.

Incidentally, the organic reaction layer 2kb formed on the surface of the bump land 2ac is removed by, for example, ashing at the time of mounting the solder bump 3 to the bump land 2ac. Accordingly, it is possible to cause the bump land 2ac to be wetted with the solder bump 3, and to cause the solder bump 3 to be favorably connected with the bump land 2ac.

In the wafer process package 5 according to the present embodiment, the first pad electrodes 2aa, which are at the outer side (end portion side) among the plurality of pad electrodes 2a arranged in two columns on the peripheral edge portion of the main surface 2b of the semiconductor chip 2, remain without any change, and the second pad electrodes 2ab in the inner-side column are connected with the rearrangement wirings 2e.

Accordingly, the plurality of first pad electrodes 2aa, which are different from the electrode for mounting of the bump, are provided at the peripheral edge portion (end portion) of the main surface 2b so that it is possible to implement the probe test using the first pad electrodes 2aa even after the solder bump are mounted. That is, it is possible to perform the probe test by bringing a probe in contact with the first pad electrode 2aa without bringing the probe in contact with the solder bump 3 even after the wafer process package 5 is assembled.

Incidentally, the first pad electrode 2aa and the second pad electrode 2ab may be formed by dividedly providing the two openings of the insulating film may be formed at the upper layer of the single elongated Al pad 2s as in the present embodiment, or by forming different Al pads 2s in advance and forming the first pad electrode 2aa and the second pad electrode 2ab to the Al pads 2s, respectively.

<Method of Manufacturing Semiconductor Device>

Next, a description will be given regarding a method of manufacturing the semiconductor device according to the present embodiment. Each of FIGS. 8 to 12 is a flow chart with a cross-sectional view illustrating a part of the method of manufacturing the semiconductor device of FIG. 1.

Figure 8:
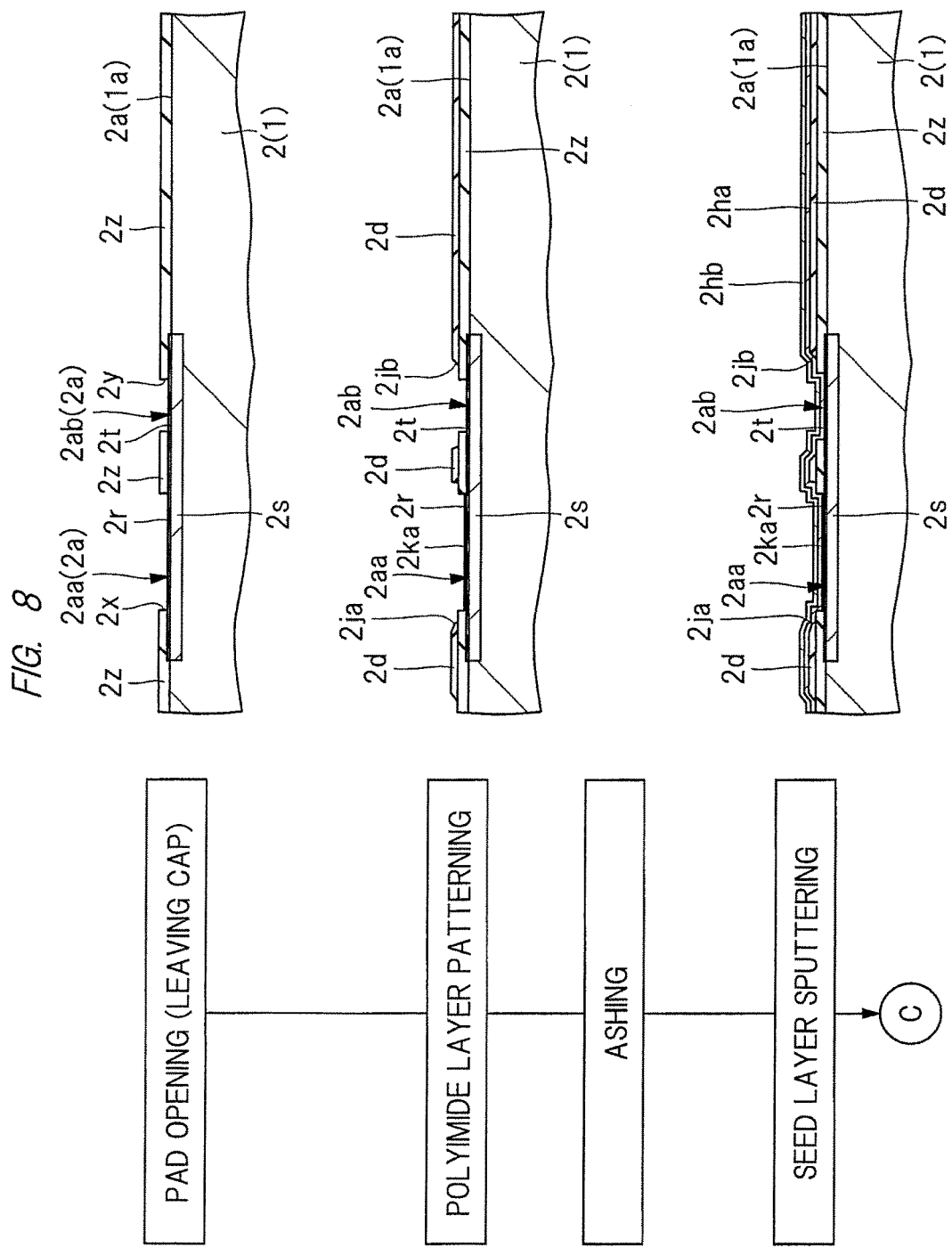
FIG. 8 is a flow chart with a cross-sectional view illustrating a part of a manufacturing method of the semiconductor device of FIG. 1.

First, pad opening (leaving a cap) illustrated in FIG. 8 is performed. In the above-described pad opening, a semiconductor wafer (semiconductor substrate) 1, which includes the plurality of semiconductor chips 2 each of which has a first region 2x and a second region 2y different from the first region 2x formed therein, is prepared. Incidentally, the plurality of wiring layers 2u, the first pad electrode 2aa provided with the first cap film 2r formed at the uppermost layer of the plurality of wiring layers 2u in the first region 2x, and the second pad electrode 2ab provided with the second cap film 2t formed at the uppermost layer of the plurality of wiring layers 2u in the second region 2y, which are illustrated in FIG. 3, are formed in each region of the semiconductor chips 2 of the semiconductor wafer 1.

Further, the Al pad 2s, which is formed in an integrally linked manner, is formed with respect to the first pad electrode 2aa and the second pad electrode 2ab. Specifically, the insulating film is interposed in the Al pad 2s having the elongated rectangular planar shape, the two openings are formed in the insulating film, and the integrally formed Al pad 2s is divided into the two electrode regions and used with the first pad electrode 2aa and the second pad electrode 2ab.

That is, the opening for the first pad electrode 2aa and the opening for the second pad electrode 2ab are formed in a protective film 2z serving as the insulating film and formed on the elongated Al pad 2s such that the first cap film 2r and the second cap film 2t remain. Incidentally, the first cap film 2r and the second cap film 2t, which are integrally formed, are arranged on the Al pad 2s. That is, the Al pad 2s is the Al pad 2s equipped with the cap film. Here, the first cap film 2r and the second cap film 2t are made of, for example, TiN.

In addition, the plurality of wiring layers 2u are formed below the first pad electrode 2aa, and further, the memory cells 2v are formed at the lowermost layer thereof as illustrated in FIG. 3, and the memory cell 2v is, for example, a non-volatile memory (flash memory).

Next, polyimide layer patterning illustrated in FIG. 8 is performed. In this polyimide layer patterning, a polyimide layer 2d is formed on the protective film 2z on a main surface 1a of the semiconductor wafer 1, and thereafter, each upper surface of the first pad electrode 2aa and the second pad electrode 2ab is opened by patterning. In other words, the polyimide layer (first insulating film) 2d, which includes the first opening 2ja causing the first cap film 2r to be exposed on the first pad electrode 2aa, and the second opening 2jb causing the second cap film 2t to be exposed on the second pad electrode 2ab, is formed.

At this time, a size of the first opening 2ja when viewed in a plan view is larger than a size of the second opening 2jb when viewed in a plan view as illustrated in FIG. 4. That is, the first pad electrode 2aa is the pad for the probe test or the wire bonding, and the second pad electrode 2ab is the pad for connection of the rearrangement wiring 2e. Accordingly, the relationship is like the first opening 2ja>the second opening 2jb. Incidentally, it is possible to easily change each size of these pads by adjusting each size of the opening portions of the insulating film (polyimide layer 2d) formed on the pads.

Ashing illustrated in FIG. 8 is performed after the above-described polyimide layer patterning. In the above-described ashing, an organic film (the organic reaction layer), formed on the surface of the second cap film 2t of the second pad electrode 2ab, is removed by the ashing.

Seed layer sputtering illustrated in FIG. 8 is performed after the above-described ashing. In this seed layer sputtering, the seed layer 2hb is formed (deposited) on the polyimide layer 2d, the first pad electrode 2aa, and the second pad electrode 2ab by sputtering. Accordingly, each of the first pad electrode 2aa and the second pad electrode 2ab is electrically connected to the seed layer 2hb. First, a Cr (chromium) film 2ha is formed as a barrier layer (conductive layer), and a Cu film 2hb is formed on the Cr film 2ha as the seed layer. In addition, the barrier layer (conductive layer) may be the above-described Cr film 2ha or a film made of titanium (TiN), and a film made of a different material from those of the first cap film 2r and the second cap film 2t is used.

Resist patterning illustrated in FIG. 9 is performed after the above-described seed layer sputtering. In this resist patterning, the entire region is covered by a resist 2g except for a portion of the rearrangement wiring 2e to be formed in the subsequent step. Specifically, the resist 2g serving as a mask layer that covers the first opening 2ja and causes the second opening 2jb to be exposed is formed on the polyimide layer (first insulating film) 2d with the seed layer 2hb interposed therebetween. That is, an upper surface of the first opening 2ja of the first pad electrode 2aa is covered by the resist 2g, and further the second opening 2jb is exposed without covering an upper surface of the second opening 2jb of the second pad electrode 2ab with the resist 2g.

Rearrangement wiring-Cu/Ni electroplating formation, illustrated in FIG. 9, is performed after the above-described resist patterning. In this rearrangement wiring-Cu/Ni electroplating formation, the rearrangement wiring (wiring) 2e, which is electrically connected to the second pad electrode 2ab and mainly contains Cu, is formed via the second opening 2jb. First, electroplating formation of Cu is performed, and thereafter, electroplating formation of Ni is performed upon the formation of the rearrangement wiring 2e.

Specifically, first, the Cu layer 2i is formed on the seed layer 2hb inside a region surrounded by the resist (mask layer) 2g by electroplating. In this manner, the rearrangement wiring 2e (the Cu layer 2i) containing Cu as the main component is formed on the seed layer 2hb. Thereafter, the Ni layer 2n is formed on the surface of the rearrangement wiring 2e by electroplating. In this manner, the seed layer 2hb, the rearrangement wiring 2e (the Cu layer 2i), and the Ni layer 2n are formed.

As a result, the rearrangement wiring 2e is formed to the second pad electrode 2ab, but is not formed to the first pad electrode 2aa.

Figure 10:
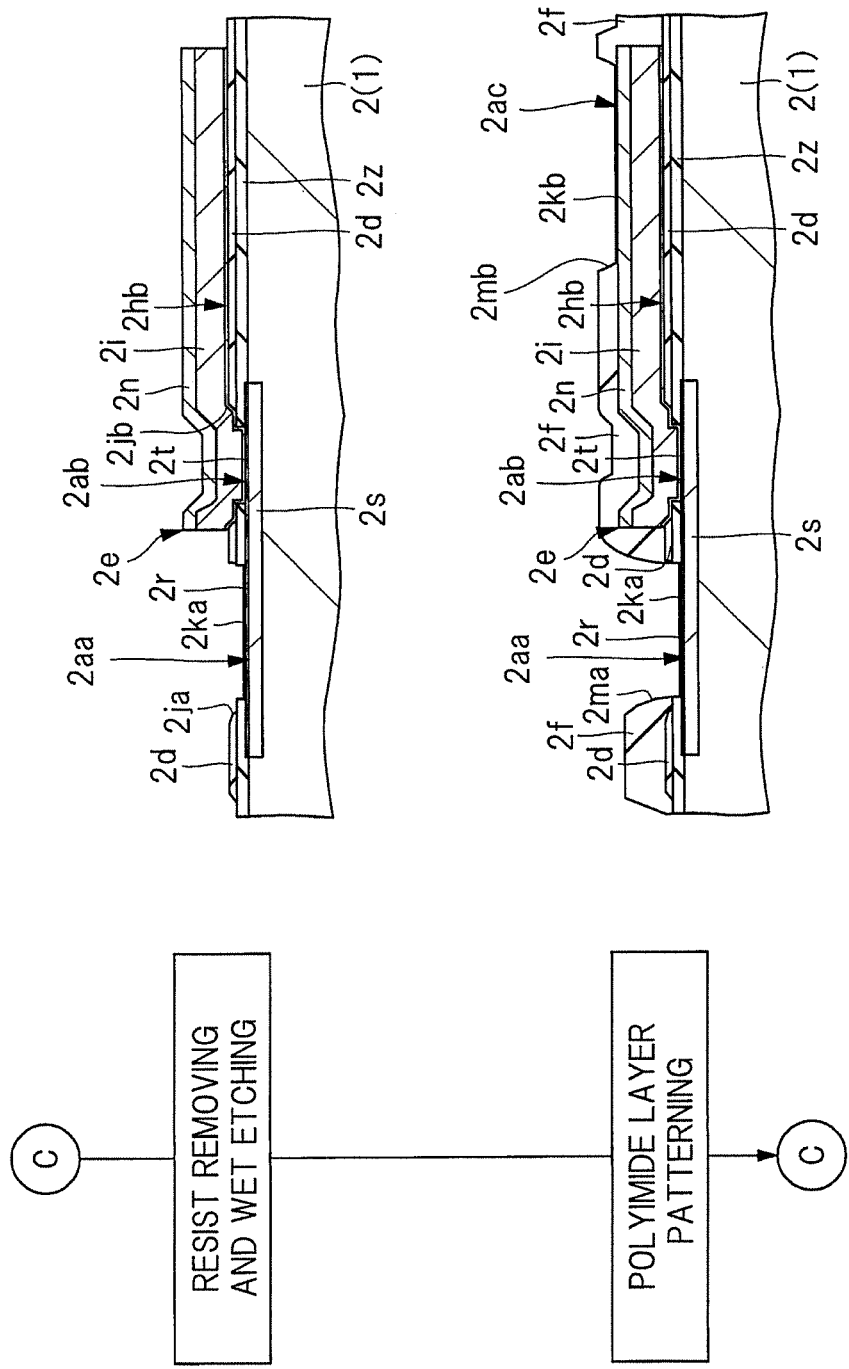
FIG. 10 is a flow chart with a cross-sectional view illustrating a part of the manufacturing method of the semiconductor device of FIG. 1.

Resist removing and wet etching illustrated in FIG. 10 are performed after the above-described rearrangement wiring-Cu/Ni electroplating formation. In this resist removing and wet etching, the resist 2g that surrounds the rearrangement wiring 2e is removed, and further, the seed layer 2hb and the Cr film 2ha on the first pad electrode 2aa (below the resist 2g) are removed.

That is, the resist 2g serving as the mask layer is removed to expose the first opening 2ja, and further, the Cu film (seed layer) 2hb and the Cr film (conductive layer) on the first cap film 2r are removed by wet etching such that the first cap film 2r of the first pad electrode 2aa remains.

At this time, the barrier layer is the Cr film 2ha, and the first cap film 2r is the TiN film, and thus, the first cap film 2r remains on the Al pad 2s without being removed even when the Cr film 2ha is removed by the wet etching. That is, the Al pad 2s is kept in the state of being covered by the first cap film 2r.

Accordingly, it is possible to prevent the Al pad 2s from corrosion.

Polyimide layer patterning illustrated in FIG. 10 is performed after the above-described resist removing and wet etching. In this polyimide layer patterning, first, the polyimide layer (second insulating film) 2f is formed on the rearrangement wiring 2e and on the first pad electrode 2aa. Further, an upper part of the end portion of the rearrangement wiring 2e and the upper surface of the first pad electrode 2aa are opened by patterning.

Specifically, a third opening 2ma is formed above the first pad electrode 2aa of the polyimide layer 2f such that the organic reaction layer 2ka remains on the surface of the first pad electrode 2aa, and a fourth opening 2mb is formed at an end portion (bump land 2ac) of the polyimide layer 2f such that the organic reaction layer 2kb remains on the surface of the end portion (bump land 2ac) of the rearrangement wiring 2e. That is, the organic reaction layer 2ka is formed on the surface of the first pad electrode 2aa, and further, the organic reaction layer 2kb is formed on the surface of the bump land 2ac by not performing the ashing. Incidentally, it is possible to form the organic reaction layers 2ka and 2kb having the anticorrosive effect in the case of only opening the polyimide layer. Accordingly, the Ni layer 2n of the bump land 2ac is not substantially oxidized, and this effect is maintained as long as the asking is not performed. Each thickness of the organic reaction layer 2ka and the organic reaction layer 2kb, which are formed at this time, is about 100 nm, for example.

In the above-described manner, the organic reaction layer 2ka is formed on a surface of the third opening 2ma of the first pad electrode 2aa, and the organic reaction layer 2kb is formed on a surface of the fourth opening 2mb in the bump land 2ac of the end portion of the rearrangement wiring 2e.

Accordingly, the first cap film 2r on the Al pad 2s is not exposed in the third opening 2ma of the first pad electrode 2aa, nor is the Ni layer 2n of the rearrangement wiring 2e exposed in the fourth opening 2mb of the bump land 2ac of the rearrangement wiring 2e.

Further, it is possible to prevent the surface of the bump land 2ac from oxidation using the organic reaction layer 2kb in the present embodiment, and thus, Au (gold) plating formation (immersion gold) is not performed on the surface of the bump land 2ac.

Figure 13:
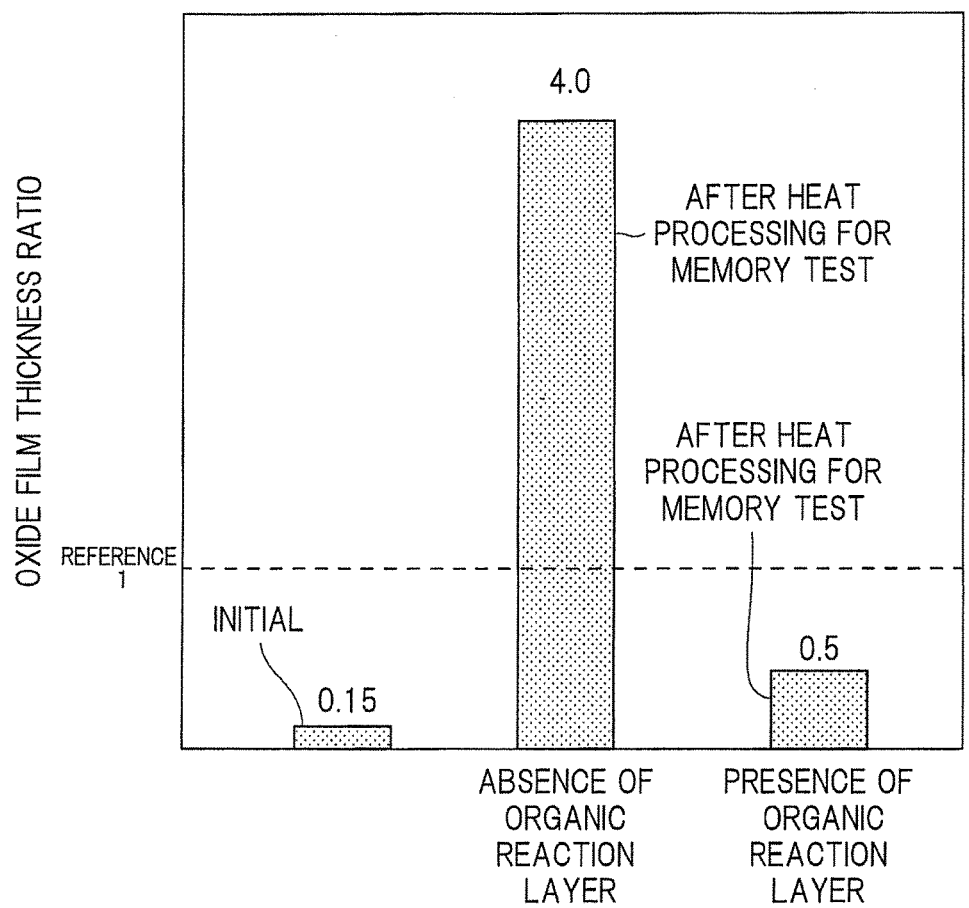
FIG. 13 is a data diagram illustrating a relationship of a thickness of an oxide film and an organic reaction layer in the method of manufacturing the semiconductor device.

Here, a description will be given regarding whether the plated film is formed depending on presence or absence of the organic reaction layer with reference to FIG. 13. FIG. 13 is a data diagram illustrating a relation between a thickness of an oxide film and the organic reaction layer in the method of manufacturing the semiconductor device of FIG. 1, and illustrates a ratio of the oxide film thickness on the basis of an initial stage of the heat processing for a memory test and a stage after the processing, and further, on the basis of "presence" and "absence" of the organic reaction layer. Incidentally, the vertical axis in FIG. 13 uses a maximum oxide film thickness (thickness of a Ni oxide film), which enables the Au plating to be formed, as Reference 1, and FIG. 13 illustrates that the Au plating can be formed in a range under or equal to Reference 1.

According to the oxide film thickness ratios of FIG. 13, a ratio is 0.5 below Reference 1 when the organic reaction layer is present after the heat processing (retention baking) for the memory test, and a ratio becomes 4.0 significantly above Reference 1 when the organic reaction layer is absent. That is, FIG. 13 illustrates that it is possible to form the Au plating even after the heat processing for the memory test as long as the organic reaction layer is formed on a metal surface.

Although the description is given regarding a case in which the Au plating is not performed on the surface of the bump land 2ac in the present embodiment as described above, the Au plating may be formed if the cost is not considered.

Figure 11:
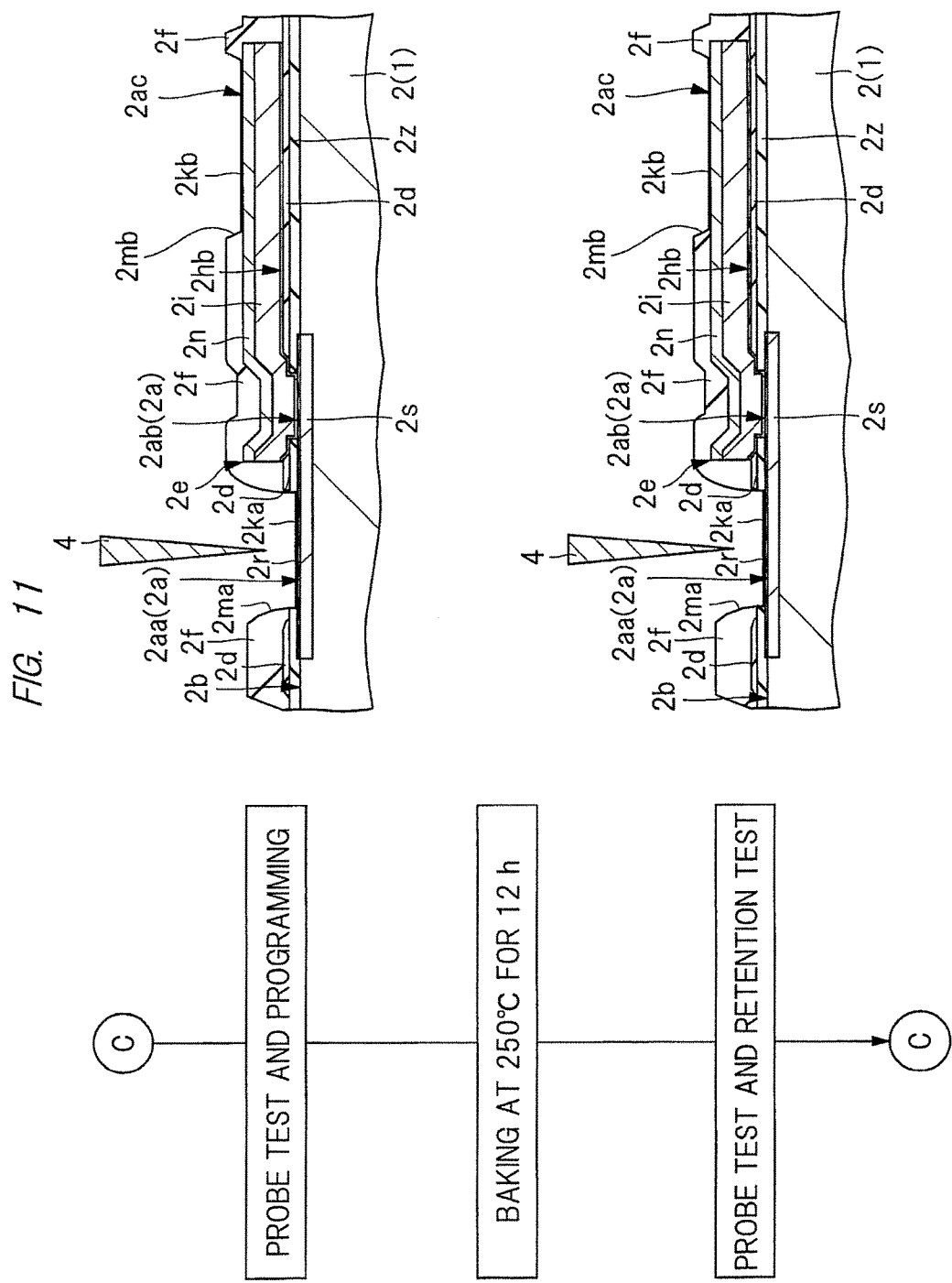
FIG. 11 is a flow chart with a cross-sectional view illustrating a part of the manufacturing method of the semiconductor device of FIG. 1.

The probe test and programming illustrated in FIG. 11 are performed after the above-described polyimide layer patterning. In this probe test (first probe test), a probe needle 4 is brought into contact with the first pad electrode 2aa to perform an electrical test, and data is programmed in the non-volatile memory (memory cell 2v). Specifically, the organic reaction layer 2ka and the first cap film 2r on the surface of the first pad electrode 2aa are pierced through by the probe needle 4 so that the probe needle 4 is brought into contact with the Al pad 2s, and the probe test (the first probe test and the programming of data in the non-volatile memory) is performed in this state.

In this manner, the first pad electrode 2aa, which is different from the second pad electrode 2ab, is formed to be exposed to the outside other than the second pad electrode 2ab for the connection of the rearrangement wiring 2e in the assembly of the semiconductor device according to the present embodiment, and thus, it is possible to perform the probe test by bringing the probe needle 4 into contact with the first pad electrode 2aa.

Baking at 250° C. for 12 h illustrated in FIG. 11 is performed after the above-described probe test and programming. That is, heat processing is performed with respect to the semiconductor wafer 1. This heat processing is a baking test (thermal load test) of the non-volatile memory (flash memory) formed in the semiconductor chip 2, and is also called a retention baking test, in which, for example, the semiconductor wafer 1 is heated at 250° C. for 12 hours (there also is a test performed for 72 hours when the test time is long). In this case, the temperature of 250° C. of the heat processing described above is higher than a melting point of the solder bump 3 (for example, 230° C. in the case of a lead-free solder).

Accordingly, the solder bump 3 is melted when the retention baking test of the non-volatile memory is performed after mounting the solder bump 3, and thus, it is necessary to perform the retention baking test before mounting the solder bump 3.

In addition, the heating is performed at 250° C. for a long period of time in the retention baking test, and thus, there is a risk that an oxide film is formed on the surface of the rearrangement wiring 2e of the bump land 2ac, but the oxidation of the Ni layer 2n does not proceed since the organic reaction layer 2kb is formed on the surface of the rearrangement wiring 2e of the bump land 2ac. That is, it is possible to prevent the oxidation of Ni in the bump land 2ac caused by the high-temperature baking (retention baking) (it is possible to protect the Ni layer 2n of the rearrangement wiring 2e using the organic reaction layer 2kb).

The probe test and a retention test illustrated in FIG. 11 are performed after the above-described baking at 250° C. for 12 hours. In this probe test, the probe needle 4 is brought into contact with the first pad electrode 2aa to perform a second probe test. The above-described second probe test tests, after the high-temperature baking of the non-volatile memory (memory cell 2v), whether the programmed data of the memory is lost or whether data failure occurs, for example.

Incidentally, the first pad electrode 2aa, different from the second pad electrode 2ab to which the rearrangement wiring 2e is connected, is formed to be exposed to the outside also in this second probe test. Thus, it is possible to perform the second probe test by bringing the probe needle 4 into contact with the first pad electrode 2aa, similarly to the first probe test.

Ashing illustrated in FIG. 12 is performed after the above-described probe test and retention test. In this step, the organic reaction layer 2kb formed on the surface of the rearrangement wiring 2e of the bump land 2ac is removed by the ashing, and accordingly, the Ni layer 2n of the bump land 2ac is exposed. Incidentally, the Au plating may be formed on the surface of the bump land 2ac in order to improve the wettability of the solder bump 3.

Bump formation illustrated in FIG. 12 is performed after the above-described ashing. In this bump formation, the solder bump 3 is mounted on the bump land 2ac which is exposed through the fourth opening 2mb of the rearrangement wiring 2e. At this time, the bump is mounted using a flux to activate the Ni layer 2n, and thereafter, reflow is performed to heat the solder bump 3, thereby melting the solder bump 3. As a result, the solder bump 3 and the Ni layer 2n of the bump land 2ac are connected to each other.

In the above-described manner, the bump formation is completed. Accordingly, the Al pad 2s and the solder bump 3 of the semiconductor chip 2 are electrically connected via the rearrangement wiring 2e.

An appearance and shear test illustrated in FIG. 12 is performed after the above-described bump formation. In this step, an appearance test of the semiconductor wafer 1 is performed, and connection strength of the solder bump 3 is tested using a shear stress.

The respective semiconductor chips 2 are cut out for singulation by dicing into pieces from the semiconductor wafer 1 after the above-described appearance and shear test, and the assembly of the wafer process package 5 illustrated in FIG. 1 is completed.

Here, the wafer process package 5 according to the present embodiment has the structure in which the non-volatile memory is formed in the semiconductor chip 2. In the probe test of the semiconductor substrate in which the non-volatile memory is formed in the above-described manner, a memory retention test of the non-volatile memory is sometimes required, but it is not possible to perform the test after mounting the bump since the test is performed at the temperature of 250° C. for 8 hours, for example, and such a temperature is higher than 230° C., which is the melting point of the lead-free solder bump. In addition, even when the test is performed before forming the rewiring, a maximum temperature in the rewiring process is 350° C., and thus if any memory loss occurs, that is meaningless. It is necessary to provide the wafer process package that allows the memory to be performed before mounting the bump after forming the rewiring on the basis of such backgrounds.

Further, the memory test is performed by bringing the probe needle 4 into contact with the pad of the rearrangement wiring 2e in the above-described memory test. The accuracy of the test decreases since the Ni layer 2n formed on the surface of the Cu layer 2i of the rearrangement wiring 2e has a large contact resistance. At this time, it is considered to perform the Au plating on the pad of the rearrangement wiring 2e in order to achieve a countermeasure against the contact resistance of the probe needle 4 and to secure the wettability of the solder bump 3, which causes Ni to spring up and be oxidized on the Au-plated film due to the retention baking, and as a result, leads to an increase of the contact resistance of the probe needle 4 and poor wettability and defective bonding of the solder.

In addition, it is also considered to perform the Au plating formation on the pad of the rearrangement wiring 2e again after the retention baking as a countermeasure against the spring-up of Ni on the Au plated film, but in this case, cost increases because the Au plating is formed twice.

Thus, in the method of manufacturing the semiconductor device according to the present embodiment, the Al pad equipped with a metal cap as well as the rewiring structure is newly added to the semiconductor chip 2 which requires to be tested at high temperature that exceeds the melting point of the solder such as the memory retention test for a long period of time. Specifically, each of the first pad electrode 2aa for the test and the second pad electrode 2ab for the lead-out of the rearrangement wiring (rewiring) 2e is provided on the main surface 2b of the semiconductor chip 2. For example, the first pad electrode 2aa, which is close to the chip end portion as illustrated in FIG. 4, is provided for the probe test, and the second pad electrode 2ab for the rearrangement wiring 2e is provided at the inner side than the first pad electrode 2aa.

At this time, the first cap film 2r and the second cap film 2t are linked to be integrally famed on the Al pad 2s of each of the first pad electrode 2aa and the second pad electrode 2ab, and the sizes of the respective openings of the electrodes are adjusted for the probe test and for the rearrangement wiring 2e to be different from each other (the size of the opening for the probe test>the size of the opening for the rearrangement wiring 2e). In addition, the Al pad 2s of the f first pad electrode 2aa and the second pad electrode 2ab is covered by a metal cap film (first cap film 2r and the second cap film 2t). Thus, the Al pad 2s is protected by the metal cap film (metal film) even when the test such as the retention baking is performed at high temperature for a long period of time.

Meanwhile, the bump land 2ac provided in the rearrangement wiring 2e (rewiring) is covered by the organic reaction layer 2kb which is extremely thin. Accordingly, it is possible to prevent the bump land 2ac from being oxidized or corroded during the heat processing such as the retention baking.

Incidentally, the thin organic reaction layer 2ka is left on the first cap film 2r of the first pad electrode 2aa provided for the probe test by not performing the ashing to process organic residues after forming the opening in the polyimide layer 2f at the upper layer. As a result, it is possible to protect the Al pad 2s in the process of forming the rearrangement wiring 2e.

As described above, it is possible to obtain both a desired heat resistance and the wettability and bonding property of the solder, and to perform the memory retention test at the high temperature exceeding the melting point of the solder bump 3 for the long period of time before forming the bump, according to the process and the structure of the present embodiment.

Incidentally, since it is unnecessary to perform the Au plating on the bump land 2ac in the method of manufacturing the semiconductor device according to the present embodiment, it is possible to suppress the cost increase in the test. Accordingly, it is possible to achieve the stabilization of the test and to enhance the reliability of the test while suppressing the cost increase and the defective bonding of the solder in the test of the semiconductor device (semiconductor chip 2).

In addition, when the test such as the retention baking is performed using the first pad electrode 2aa provided at the end portion of the main surface 2b of the semiconductor chip 2, a cantilever is used, and thus, the probe needle 4 is brought into contact by penetrating the thin organic reaction layer 2ka and the first cap film 2r. Accordingly, failure of conduction in the test is not caused.

In addition, the solder bump 3 is mounted to the bump land 2ac of the rearrangement wiring 2e to which the solder bump 3 is mounted after performing the ashing to remove the organic reaction layer 2kb and to expose the Ni layer 2n of the bump land 2ac. Thus, it is possible to mount the bump without inhibiting the alloying reaction with respect to the solder bump 3.

In addition, since the bump land 2ac is formed by leading out the rearrangement wiring 2e from the second pad electrode 2ab, it is possible to correspond to a decrease in pitch of the bump land 2ac.

In addition, the first pad electrode 2aa for the test (probe test) and the bump land 2ac for the bump mounting are divided, and thus, the bump mounting is performed after the high-temperature storage test such as the retention baking, the quality of the bump mounting is not degraded. Further, it is possible to perform the test using the first pad electrode 2aa for the test even after mounting the bump in the wafer process package 5 according to the present embodiment.

Modification Example

Figure 14:
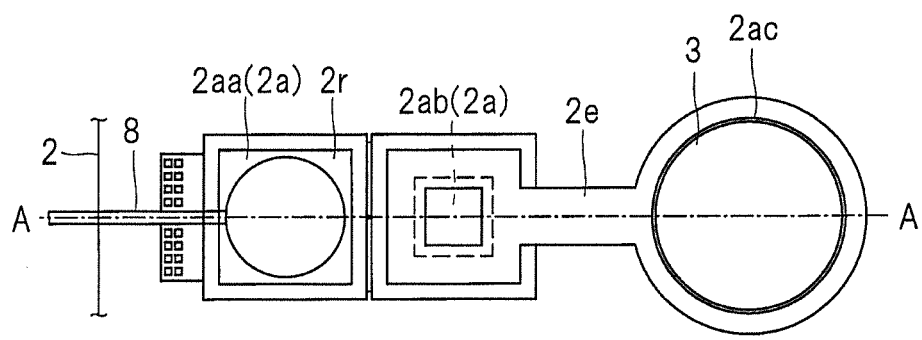
FIG. 14 is an enlarged partial plan view illustrating a structure of a modification example of the embodiment.
Figure 15:
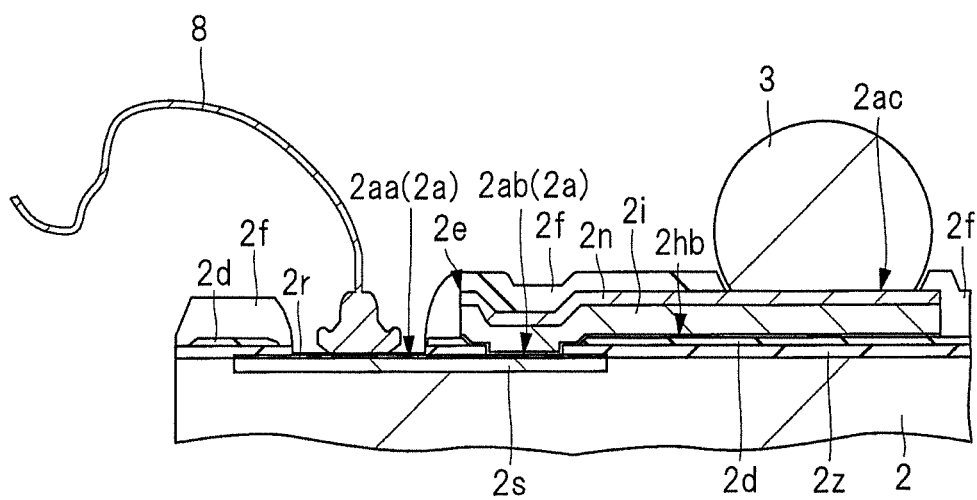
FIG. 15 is a partial cross-sectional view illustrating a structure taken along a line A-A illustrated in FIG. 14.
Figure 16:
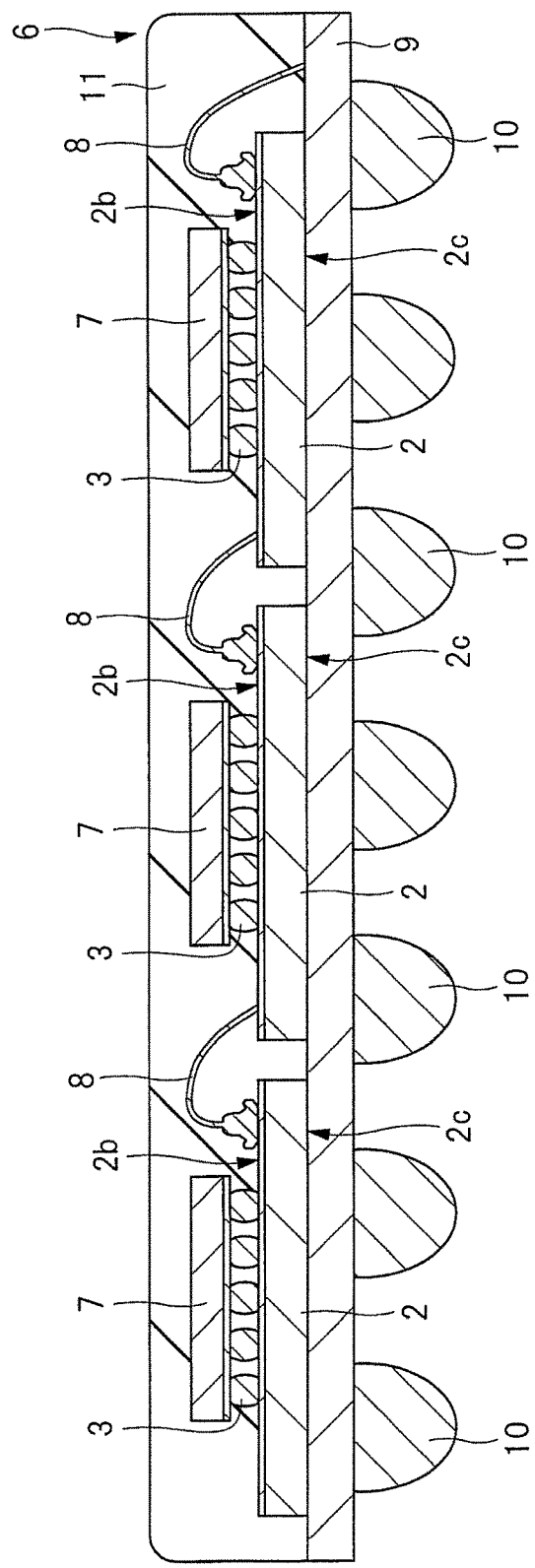
FIG. 16 is a cross-sectional view illustrating a structure of a semiconductor device to which the modification example of the embodiment is applied.

FIG. 14 is an enlarged partial plan view illustrating a structure of a modification example of the embodiment, FIG. 15 is a partial cross-sectional view illustrating a structure taken along a line A-A illustrated in FIG. 14, and FIG. 16 is a cross-sectional view illustrating a structure of a semiconductor device to which the modification example of the embodiment is applied.

The modification example has structure in which the semiconductor chip 2 according to the embodiment described above is incorporated in a system in package (SIP) 6 illustrated in FIG. 16, and chips are electrically connected to each other using a wire 8.

That is, the semiconductor device has the structure in which the wire (metal wire) 8 is connected to the first pad electrode 2aa for the probe test illustrated in FIG. 14, and the neighboring semiconductor chips 2 are connected using via wire as illustrated in FIG. 16.

That is, the wire 8 such as the metal wire is connected to the first pad electrode 2aa for the test (probe test), which is arranged near an end portion (outer peripheral portion) of the semiconductor chip 2 as illustrated in FIG. 15. When the first pad electrode 2aa is used for the pad for the wire bonding, it is possible to apply the semiconductor device to the SIP 6 which is a chip on chip (COC) as illustrated in FIG. 16.

The SIP 6 illustrated in FIG. 16 is configured such that small semiconductor chips 7 are mounted on each of the plurality of semiconductor chips 2, which are mounted on a package substrate 9, via the plurality of solder bumps 3 using flip-chip connection. Specifically, the plurality of semiconductor chips 2 are mounted on the package substrate 9 such that the respective back surfaces 2c thereof oppose the package substrate 9 using face-up mounting, and further, the small semiconductor chips 7 are flip-chip connected with each other via the plurality of solder bumps 3 on the semiconductor chip 2, respectively.

Further, the neighboring semiconductor chips 2 are electrically connected via the wire 8 using a difference in planar size between the semiconductor chip 2 and the semiconductor chip 7. Further, the respective semiconductor chips 2 and the plurality of wires 8 are resin-sealed by a sealing body 11 made of resin. In addition, a plurality of ball electrodes 10 are provided on a lower surface of the package substrate 9 as external terminals. That is, the SIP 6 illustrated in FIG. 16 is the semiconductor device of a type in which the flip-chip mounting and the wire bonding mounting are mixed.

In the SIP 6, the semiconductor chip 7 on an upper stage side is, for example, a memory chip, and the semiconductor chip 2 on a lower stage side is, for example, a control chip that controls the semiconductor chip 7.

In the above-described SIP 6, the first pad electrode 2aa and the second pad electrode 2ab are formed to the semiconductor chip 2, the first pad electrode 2aa is used for the wire connection, and the second pad electrode 2ab is used for the lead-out of the rearrangement wiring 2e as illustrated in FIGS. 14 and 15. Further, the bump land lac formed at the rearrangement wiring 2e is used as the flip-chip connection of the semiconductor chip 7 on the upper stage side, and the semiconductor chip 2 on the lower stage side and the semiconductor chip 7 on the upper stage side are electrically connected via the plurality of solder bumps 3.

It is possible to apply the semiconductor chip 2 according to the present embodiment to the COC structure and the SIP structure by forming the first pad electrode 2aa and the second pad electrode 2ab in the semiconductor chip 2 as described above.

In the foregoing, the invention made by the inventor has been specifically described based on the embodiments. However, it is needless to say that the present invention is not limited to the foregoing embodiments and various modifications can be made within the gist of the present invention.

The description has been given regarding a case in which the semiconductor device is the wafer process package in the above-described embodiment, but the above-described semiconductor device may be another semiconductor package as long as including the rearrangement wiring and the semiconductor chip 2 which is provided with the second pad electrode 2ab to which the rearrangement wiring is connected, and the first pad electrode 2aa different from the second pad electrode 2ab.

In addition, the description has been given regarding a case in which the first pad electrode 2aa and the second pad electrode 2ab are provided on the single integrally-formed Al pad 2s in the above-described embodiment, but the first pad electrode 2aa and the second pad electrode 2ab may be pads in a structure of being formed on the different Al pads 2s, and are connected via an internal wiring.

Further, within the gist of the technical idea described above in the embodiment, one or more combination modification examples can be used.

What is claimed is:

1. A method of manufacturing a semiconductor device comprising:
   (a) forming a pad over a semiconductor substrate;
   (b) forming a first insulating film over the semiconductor substrate, the first insulating film having a first opening exposing a first region of the pad and a second opening exposing a second region of the pad different from the first region;
   (c) forming a metal film connected to the pad in the second opening, while covering the first opening with a mask layer;
   (d) forming a second insulating film over the first insulating film so as to expose a part of the metal film; and
   (e) disposing a conductive material on the part of the metal film exposed by the second insulating film, wherein
   the step (d) comprises:
      (d1) forming the second insulating film over the first insulating film,
      (d2) after the (d1), performing a probe test by using a probe needle, and
      (d3) after the (d2), removing an organic reaction layer derived from the second insulating film remained on the part of the metal film.

2. The method of manufacturing a semiconductor device according to claim 1, wherein, in the step (d3), the organic reaction layer is removed by ashing.

3. The method of manufacturing a semiconductor device according to claim 1, wherein, before the step (d3), a thickness of the organic reaction layer derived from the second insulating film remained on the part of the metal film is about 100 nm.

4. The method of manufacturing a semiconductor device according to claim 1, wherein the step (d) further comprises step (d4) performing heat processing, after performing the step (d2) and before performing the step (d3), and
   wherein a temperature of the heat processing is greater than a melting point of the conductive material.

5. The method of manufacturing a semiconductor device according to claim 1, wherein the pad has a rectangular planar shape.

6. The method of manufacturing a semiconductor device according to claim 1, wherein the second insulating film is comprised of polyimide.

7. The method of manufacturing a semiconductor device according to claim 1, wherein a size of the first opening is larger than a size of the second opening in plan view.

8. The method of manufacturing a semiconductor device according to claim 1, wherein the metal film is comprised of a Cu layer and a Ni layer formed on the Cu layer.

9. The method of manufacturing a semiconductor device according to claim 1, wherein the pad is an Al pad.

10. The method of manufacturing a semiconductor device according to claim 1, wherein the second insulating film has a fourth opening communicating with the first opening.

11. The method of manufacturing a semiconductor device according to claim 1, wherein the second insulating film has a third opening communicating with the second opening.

12. The method of manufacturing a semiconductor device according to claim 1, wherein the conductive material is a bump.

* * * * *